United States Patent
Narita et al.

(10) Patent No.: US 11,115,035 B2
(45) Date of Patent: Sep. 7, 2021

(54) SEMICONDUCTOR DEVICES

(71) Applicant: MITSUBISHI HEAVY INDUSTRIES, LTD., Tokyo (JP)

(72) Inventors: Takanori Narita, Tokyo (JP); Daisuke Matsuura, Tokyo (JP); Shigeru Ishii, Tokyo (JP); Daisuke Kobayashi, Tokyo (JP); Kazuyuki Hirose, Tokyo (JP); Osamu Kawasaki, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 16/970,750

(22) PCT Filed: Jun. 5, 2019

(86) PCT No.: PCT/JP2019/022356
§ 371 (c)(1),
(2) Date: Aug. 18, 2020

(87) PCT Pub. No.: WO2019/239984
PCT Pub. Date: Dec. 19, 2019

(65) Prior Publication Data
US 2021/0099180 A1   Apr. 1, 2021

(30) Foreign Application Priority Data

Jun. 15, 2018   (JP) .............................. JP2018-114846

(51) Int. Cl.
*H03L 7/093*   (2006.01)
*H03H 11/26*   (2006.01)
(Continued)

(52) U.S. Cl.
CPC ............. *H03L 7/093* (2013.01); *H03H 11/26* (2013.01); *H03K 5/1252* (2013.01); *H03K 5/131* (2013.01)

(58) Field of Classification Search
CPC ...... H03H 11/26; H03H 11/265; H03K 5/125; H03K 5/1252; H03K 5/1254; H03K 5/13;
(Continued)

(56) References Cited

U.S. PATENT DOCUMENTS 6,728,327 B1   4/2004   Schoner
2002/0114406 A1*   8/2002   Mashimo ............... G11B 20/24
375/322

FOREIGN PATENT DOCUMENTS

EP   0 570 158   11/1993
EP   2 645 568   10/2013
(Continued)

OTHER PUBLICATIONS

International Search Report dated Sep. 10, 2019 in International (PCT) Application No. PCT/JP2019/022356.
(Continued)

*Primary Examiner* — Diana J. Cheng
(74) *Attorney, Agent, or Firm* — Wenderoth, Lind & Ponack, L.L.P.

(57) ABSTRACT

A semiconductor device includes first to N-th PLL circuits configured to operate in synchronization with a common reference clock signal to output first to N-th clock signals, respectively; a majority circuit that performs a majority operation on the first to N-th clock signals to generate a majority clock signal; and a filter circuit to which the majority clock signal is provided, the filter circuit operating as a low-pass filter to output an output clock signal. N is an odd number of three or more.

12 Claims, 8 Drawing Sheets

(51) Int. Cl.
*H03K 5/1252* (2006.01)
*H03K 5/131* (2014.01)
(58) Field of Classification Search
CPC ........ H03K 5/131; H03K 5/133; H03K 5/134; H03K 5/135; H03K 5/14
See application file for complete search history.

(56) References Cited

FOREIGN PATENT DOCUMENTS

| | | |
|---|---|---|
| JP | 59-34013 | 8/1984 |
| JP | 6-303135 | 10/1994 |
| JP | 07-193495 | 7/1995 |
| JP | 2003-163583 | 6/2003 |
| WO | 02/078228 | 10/2002 |

OTHER PUBLICATIONS

Extended European Search Report dated Dec. 17, 2020 in corresponding European Patent Application No. 19818654.6.
International Preliminary Report on Patentability and Written Opinion of The International Searching Authority dated Dec. 24, 2020 in International (PCT) Application No. PCT/JP2019/022356 (English translation).

* cited by examiner

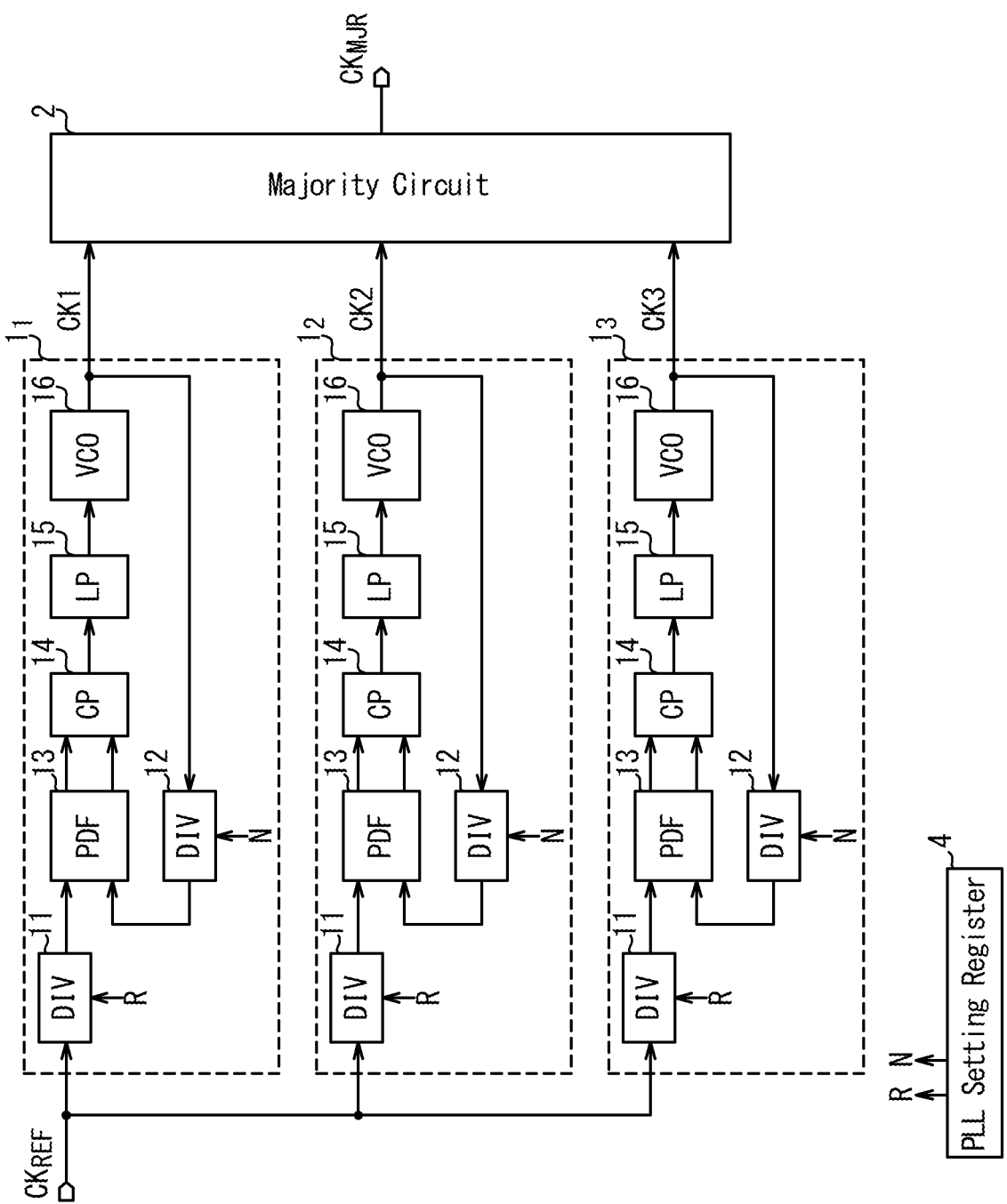
F I G. 2

SEMICONDUCTOR DEVICES

TECHNICAL FIELD

The present invention relates to semiconductor devices, more particularly, to semiconductor devices preferably used to generate clock signals.

BACKGROUND ART

Clock signals are widely used to establish circuit synchronization in integrated circuits. Most typically, a clock signal is generated by a phase locked loop (PLL) circuit and delivered to circuits which should operate synchronously.

Reliability improvement of a circuit that generate a clock signal is effective for reliability improvement of the overall operation of a semiconductor integrated circuit. This issue is especially important to an integrated circuit used in an environment with intense radiation, such as the outer space. A PLL circuit may malfunction in an environment with intense radiation. A malfunction of a PLL circuit that generates a clock signal may cause a malfunction of a semiconductor integrated circuit.

From such background, there has been a need for providing a technology for improving reliability of a circuit that generates a clock signal.

It should be noted that JP 2003-163583 A discloses a non-synchronous noise filter circuit that can remove noise even when the noise level exceeds the threshold level of an input logic circuit.

CITATION LIST

Patent Literature

[Patent Literature 1] JP 2003-163583 A

SUMMARY OF THE INVENTION

Therefore, an objective of the present invention is to provide a technology for improving reliability of a circuit that generate a clock signal. Other objectives and new features of the present invention would be understood by a person skilled in the art from the following disclosure.

In one aspect of the present invention, a semiconductor device includes: first to N-th PLL circuits configured to operate in synchronization with a common reference clock signal to output first to N-th clock signals, respectively, for N being an odd number of three or more; a majority circuit that performs a majority operation on the first to N-th clock signals to generate a majority clock signal; and a filter circuit to which the majority clock signal is provided, the filter circuit operating as a low pass filter to output an output clock signal.

In one embodiment, the filter circuit includes a first RS flipflop that has a reset terminal to which the majority clock signal or an inverted signal thereof is provided; and a first delay circuit that supplies a first delayed signal to a set terminal of the first RS flipflop, the first delayed signal being generated by delaying the majority clock signal. The output clock signal is generated in response to a signal output from a data output of the first RS flipflop.

The filter circuit may include a first inverter to which the majority clock signal is provided. In this case, the output signal of the first inverter is provided to the reset terminal of the first RS flipflop.

It is preferable that the first delay circuit is configured such that the delay time thereof is variable. In this case, it is preferable that the semiconductor device further includes a delay setting register that stores delay setting data specifying the delay time of the first delay circuit.

In another embodiment, the semiconductor device may further include a delay setting circuit that sets the delay time of the first delay circuit based on PLL setting data specifying an oscillation frequency of the first to N-th PLL circuits.

In one embodiment, the filter circuit includes: a first filter to which the majority clock signal is provided; a second inverter to which an output signal of the first filter is provided; and a second filter to which an output signal of the second inverter is provided. The first filter is configured to output a clock signal with a duty ratio different from that of the majority clock signal. The first filter and the second filter have the same configuration.

In one embodiment, the filter circuit may include: a first filter to which the majority clock signal is provided; a second inverter to which an output signal of the first filter is provided; and a second filter to which an output signal of the second inverter is provided. In one embodiment, the first filter includes: a third inverter to which the majority clock signal is provided; a first RS flipflop; and a first delay circuit that supplies a first delay signal to a set terminal of the first RS flipflop, the first delay signal being generated by delaying the majority clock signal. The second filter includes: a fourth inverter to which an output signal of the second inverter is provided; a second RS flipflop; and a second delay circuit that supplies a second delay signal to a set terminal of the second RS flipflop, the second delay signal being generated by delaying the output signal of the second inverter.

In one embodiment, the first delay circuit and the second delay circuit are configured to have the same delay time, the delay time being variable. In this case, the semiconductor device may include a delay setting circuit that sets the delay time of the first delay circuit and the second delay circuit based on PLL setting data that specifies an oscillation frequency of the first to N-th PLL circuits.

The present invention effectively improves reliability of a circuit that generates a clock signal.

BRIEF DESCRIPTION OF DRAWINGS

FIG. 2 is a block diagram illustrating one example of the configuration of a PLL circuit.

DESCRIPTION OF EMBODIMENTS

A description is given below of embodiments with reference to the attached drawings.

Figure 1:
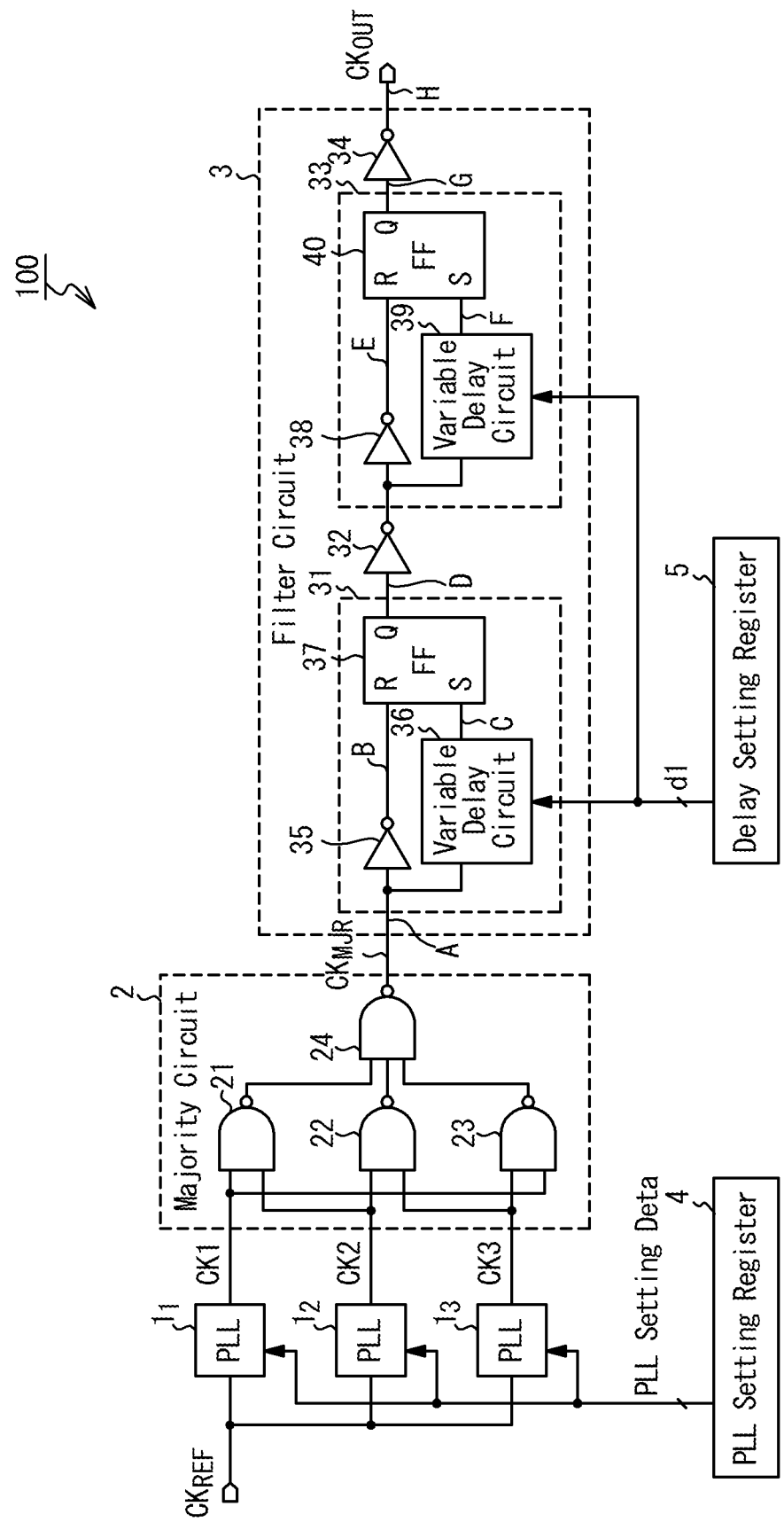
FIG. 1 is a block diagram illustrating the configuration of a semiconductor device, according to one embodiment.

FIG. 1 is a block diagram illustrating the configuration of a semiconductor device 100, according to one embodiment. The semiconductor device 100 is configured to generate an output clock signal $CK_{OUT}$ with high reliability through multiplexing of PLL circuits even in an environment with intense radiation. More specifically, the semiconductor device 100 includes PLL circuits $1_1$ to $1_3$, a majority circuit 2, and a filter circuit 3.

The PPL circuits $1_1$ to $1_3$ are commonly supplied with a reference clock signal $CK_{REF}$. The PPL circuits $1_1$ to $1_3$ generate clock signals CK1 to CK3, respectively, which are synchronous with the reference clock signal $CK_{REF}$. The PLL circuit $1_1$ to $1_3$ are connected to a PLL setting register 4 to generate the clock signals CK1 to CK3 at a frequency specified by the PLL setting data set to the PLL setting register 4. In one embodiment, the setting data may include frequency dividing ratios of frequency dividers incorporated in the PLL circuits $1_1$ to $1_3$.

FIG. 2 is a block diagram illustrating one example of the configurations of the PLL circuits $1_1$ to $1_3$. In this embodiment, the PLL circuits $1_1$ to $1_3$ have the same configuration, each including frequency dividers 11, 12, a phase comparator 13, a charge pump 14, a loop filter 15, and a voltage-controlled oscillator (VCO) 16. The output signals of the voltage-controlled oscillators 16 of the PLL circuits $1_1$ to $1_3$ are provided to the majority circuit 2 as the clock signals CK1 to CK3.

The frequency divider 11 frequency-divides the reference clock $CK_{REF}$, and the frequency divider 12 frequency-divides the output signal of the voltage-controlled oscillator 16. The frequency dividing ratio of the frequency divider 11 is R, and the frequency of the output signal of the frequency divider 11 is one R-th of the frequency of the reference clock signal $CK_{REF}$. Meanwhile, the frequency dividing ratio of the frequency divider 12 is N, and the frequency of the output signal of the frequency divider 12 is one N-th of the frequency of the output signal of the voltage-controlled oscillator 16.

The phase comparator 13 compares the phases of the output signals of the frequency dividers 11 and 12 to output an output signal corresponding to the phase difference between the output signals of the frequency dividers 11 and 12.

The charge pump 14 supplies a voltage signal to the voltage-controlled oscillator 16 via the loop filter 15 in response to the output signal from the phase comparator 13, the voltage signal having a signal level corresponding to the phase difference between the output signals of the frequency dividers 11 and 12. In one embodiment, the loop filter 15 is configured as a low pass filter.

The frequency dividing ratios R and N of the frequency dividers 11 and 12 are specified by the PLL setting data stored in the PLL setting register 4. The oscillation frequency of the PLL circuits $1_1$ to $1_3$ is set to a desired frequency by appropriately setting the frequency dividing ratios R and N of the frequency dividers 11 and 12 with the PLL setting data.

Referring back to FIG. 1, the majority circuit 2 generates a majority clock signal $CK_{MJR}$ by performing a majority operation on the clock signals CK1 to CK3 received from the PLL circuits $1_1$ to $1_3$. The majority operation is an operation that obtains an output having the state of the majority of all the inputs. In this embodiment, the majority circuit 2 comprises NAND gates 21 to 24.

The NAND gate 21 has a first input to which the clock signal CK1 is provided from the PLL circuit 1 and a second input to which the clock signal CK2 is provided from the PLL circuit $1_2$. The NAND gate 21 outputs an output signal having the value of the NAND of the clock signals CK1 and CK2. The NAND gate 22 has a first input to which the clock signal CK2 is provided from the PLL circuit $1_2$ and a second input to which the clock signal CK3 is provided from the PLL circuit $1_3$. The NAND gate 22 outputs an output signal having the value of the NAND of the clock signals CK2 and CK3. The NAND gate 23 has a first input to which the clock signal CK3 is provided from the PLL circuit $1_3$ and a second input to which the clock signal CK1 is provided from the PLL circuit $1_1$. The NAND gate 23 outputs an output signal having the value of the NAND of the clock signals CK3 and CK1. The NAND gate 24 has first to third inputs to which the output signals of the NAND gates 21 to 23 are provided, respectively, and outputs an output signal that has the value of the NAND of the output signals of the NAND gates 21 to 23. The output signal of the NAND gate 24 is the majority clock signal $CK_{MJR}$.

Since the majority clock signal $CK_{MJR}$ output from the majority circuit 2 is obtained by performing the majority operation on the clock signal CK1 to CK3, it is possible to properly generate the majority clock signal $CK_{MJR}$ even when one of the PLL circuits $1_1$ to $1_3$ malfunctions, for example, due to an effect of the radiation.

There may be, however, a phase difference among the clock signals CK1 to CK3 output from the PLL circuits $1_1$ to $1_3$, since the PLL circuits $1_1$ to $1_3$ each have an independent feedback loop. The phase difference among the clock signals CK1 to CK3 may generate noise in the majority clock signal $CK_{MJR}$.

Figure 3:
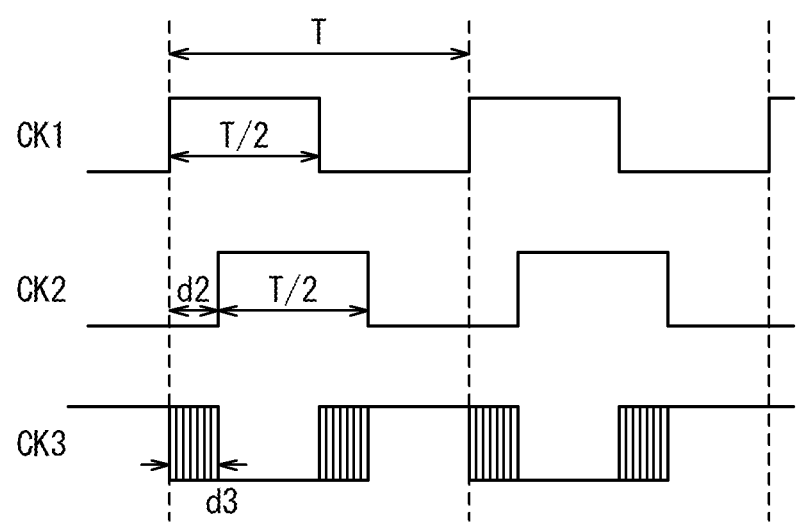
FIG. 3 is a timing chart illustrating an example of a phase difference that generates noise in a majority clock signal.

FIG. 3 illustrates example phase differences among the clock signals CK1 to CK3 that generate noise in the majority clock signal $CK_{MJR}$. In the example of FIG. 3, the clock signals CK1 to CK3 have the same periodicity T. The clock signal CK2 is delayed from the clock signal CK1 by a delay time d2. The clock signal CK3 is inverted from the clock signal CK1 (that is, delayed by T/2) and further delayed by a delay time d3.

Figure 4:
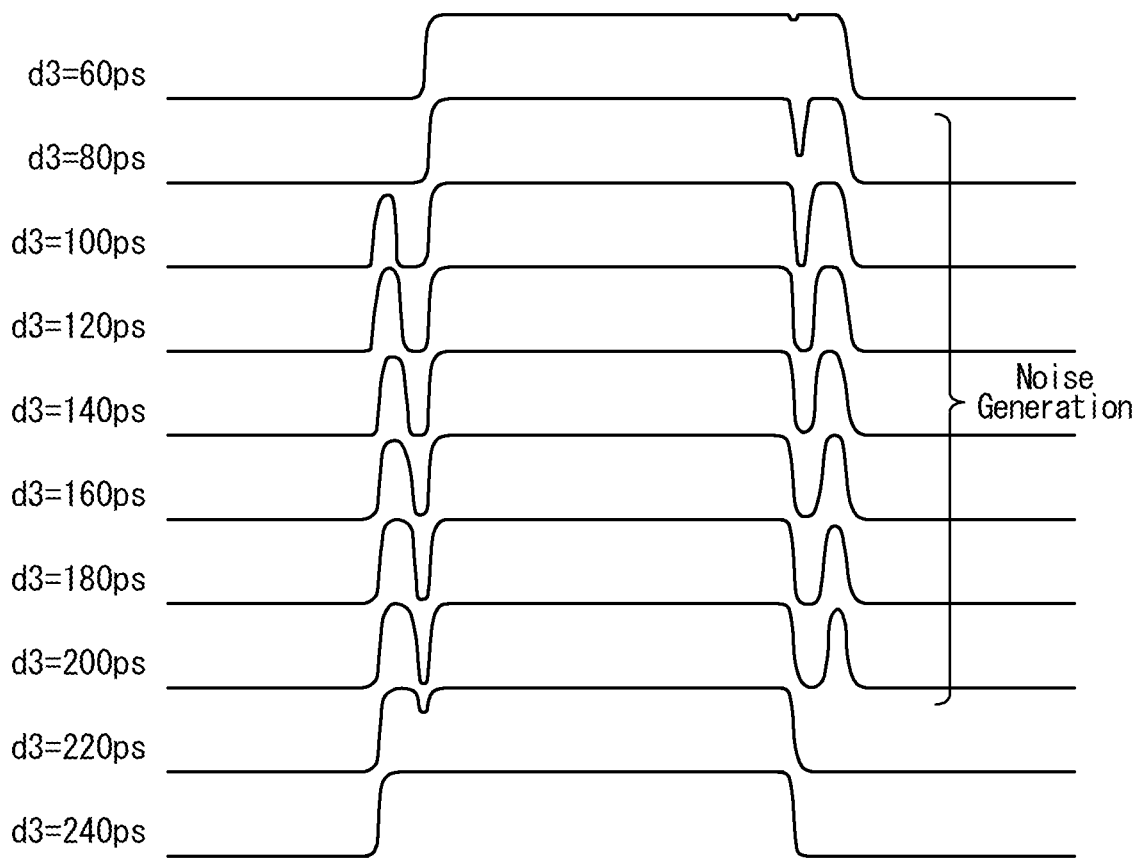
FIG. 4 is a timing chart illustrating a waveform simulation result of the majority clock signal.

FIG. 4 illustrates a simulation result of the waveform of the majority clock signal $CK_{MJR}$ for the case when the frequency of the clock signals CK1 to CK3 is 200 MHz; the delay time d2 of the clock signal CK2 is 300 ps; and the delay time d3 of the clock signal CK3 is 60 to 240 ps. When the delay time d3 is 80 to 200 ps, as understood from FIG. 4, significant noise is generated near the rising edges and falling edges of the pulses of the majority clock signal $CK_{MJR}$, causing a waveform distortion of the majority clock signal $CK_{MJR}$. Such a waveform distortion is unpreferable.

In this embodiment, to remove the above-mentioned noise, the majority clock signal $CK_{MJR}$ is provided to the filter circuit 3 that operates as a low-pass filter, and the output clock signal $CK_{OUT}$ is output from the filter circuit 3.

Referring back to FIG. 1, in this embodiment, the filter circuit 3 comprises a former stage filter 31, an inverter 32, a latter stage filter 33, and an inverter 34.

The former stage filer 31 includes an inverter 35, a variable delay circuit 36, an RS flipflop 37. The inverter 35 has an input to which the majority clock signal $CK_{MJR}$ is provided and supplies an inverted signal obtained by inverting the majority clock signal $CK_{MJR}$ to the reset terminal of the RS flipflop 37. The variable delay circuit 36 supplies a delayed signal obtained by delaying the majority clock signal $CK_{MJR}$ to the set terminal of the RS flipflop 37. The variable delay circuit 36 is configured to have a variable delay time. The delay time d1 of the variable delay circuit 36 is set in accordance with the oscillation frequency of the PLL circuits $1_1$ to $1_3$. In this embodiment, the delay time d1 of the variable delay circuit 36 is specified by delay setting data stored in a delay setting register 5.

The inverter 32 supplies an inverted signal of the output signal of the former filter 31 to the latter filter 33.

The latter stage filter 33, which has the same configuration as the former stage filter 31, includes an inverter 38, a variable delay circuit 39, and an RS flipflop 40. The inverter 38 has an input to which the output signal of the inverter 32 is provided and supplies an inverted signal obtained by inverting the output signal of the inverter 32 to the reset terminal of the RS flipflop 40. The variable delay circuit 39 supplies a delayed signal obtained by delaying the output signal of the inverter 32 to the set terminal of the RS flipflop 40. The variable delay circuit 39 is configured to have a variable delay time. The variable delay circuit 39 is configured with the delay setting data stored in the delay setting register 5 so that the variable delay circuit 39 has the same delay time d1 as that of the variable delay circuit 36 of the former stage filter 31.

The inverter 34 generates an inverted signal of the output signal of the latter stage filter 33 and outputs the inverted signal as the output clock signal $CK_{OUT}$.

The former stage filter 31 and the latter stage filter 33 function as a low-pass filter by setting the delay time d1 of the variable delay circuits 36 and 39 of the former stage filter 31 and the latter stage filter 33 in accordance with the oscillation frequency of the PLL circuits $1_1$ to $1_3$.

The former filter 31 operates as a low-pass filter by itself, having a noise removal function; however, the duty ratio of the output signal of the former stage filter 31 does not become 50% even when the duty ratio of the majority clock signal $CK_{MJR}$ is 50%, because the former stage filter 31 operates to enlarge the pulse width (or lengthen the time duration during which the output signal of the former stage filter 31 is kept at the high level) by the delay time d1 of the variable delay circuit 36.

The inverter 32 and the latter stage filter 33 are used to obtain the output clock signal $CK_{OUT}$ with a duty ratio of 50%. The latter stage filter 33 has the same configuration as the former stage filter 31 and operates to enlarge the pulse width of the inverted signal of the output signal of the former stage filter 31 by the delay time d1 of the variable delay circuit 39. As such, the duty ratio of the output signal of the latter stage filter 33 becomes 50%.

Figure 5:
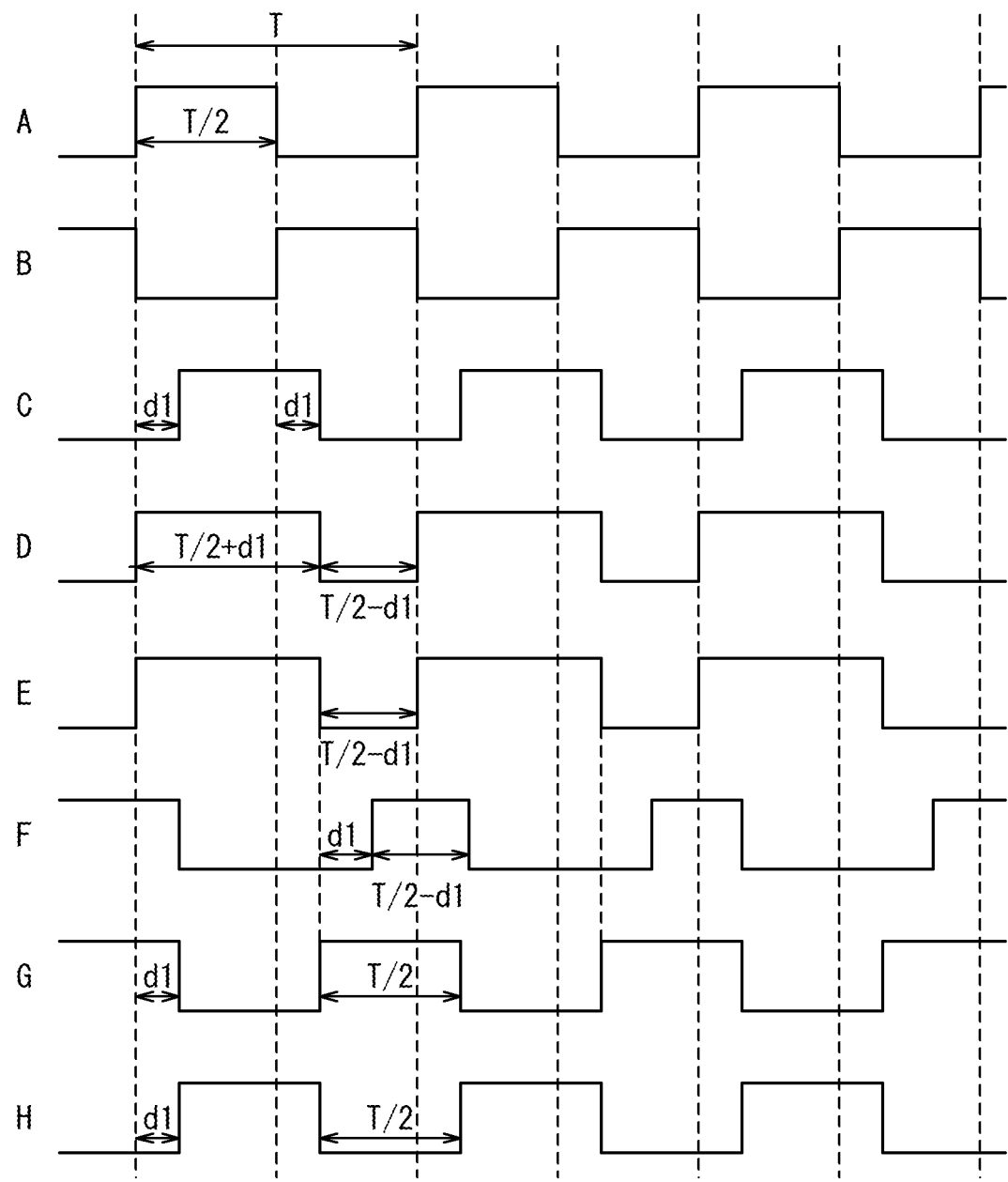
FIG. 5 is a timing chart illustrating the operations of a former stage filter and a latter stage filter.

FIG. 5 is a timing chart illustrating an example operation of the former stage filter 31 and the latter stage filter 33. The legends "A" to "H" indicate signal waveforms at the nodes A to H of the filter circuit 3, respectively.

The former stage filter 31 operates as follows. The duty ratio of the signal waveform at the node A, to which the majority clock signal $CK_{MJR}$ is supplied, is 50%. At the node B, an inverted signal of the majority clock signal $CK_{MJR}$ is generated. At the node C, a delayed signal obtained by delaying the majority clock signal $CK_{MJR}$ by the delay time d1 is generated.

Since the node B is connected to the reset terminal of the RS flipflop 37 and the node C is connected to the set terminal of the RS flipflop 37, a signal obtained by enlarging the pulse width of the majority clock signal $CK_{MJR}$ by the delay time d1 is generated at the node D, which is connected to the data output of the RS flipflop 37.

Meanwhile, the latter stage filter 33 operates similarly to the former stage filter 31 in connection with the inverted signal of the output signal from the former stage filter 31. At the node E, an inverted signal of the output signal of the inverter 32 is generated. At the node F, a delayed signal obtained by delaying the output signal of the inverter 32 by the delay time d1 is generated. Since the node E is connected to the reset terminal of the RS flipflop 40 and the node F is connected to the set terminal of the RS flipflop 40, a signal obtained by enlarging the pulse width of the output signal of the inverter 32 (that is, the inverted signal of the output signal of the former stage filter 31) by the delay time d1 is generated at the node G, which is connected to the data output of the RS flipflop 40. As such, the duty ratios of the output signal of the latter stage filter 33 and the output clock signal CKOUT become 50%.

It should be noted that, since the inverter 35 and the variable delay circuit 36 of the former stage filter 31 collectively offer the function of supplying the majority clock signal $CK_{MJR}$ to the reset terminal and the set terminal of the RS flipflop 37 with an appropriate phase difference, the inverter 35 may be unnecessary if the delay time d1 of the variable delay circuit 36 is appropriately set. The inverter 38 of the latter stage 33 may be also unnecessary for the same reason.

Figure 6:
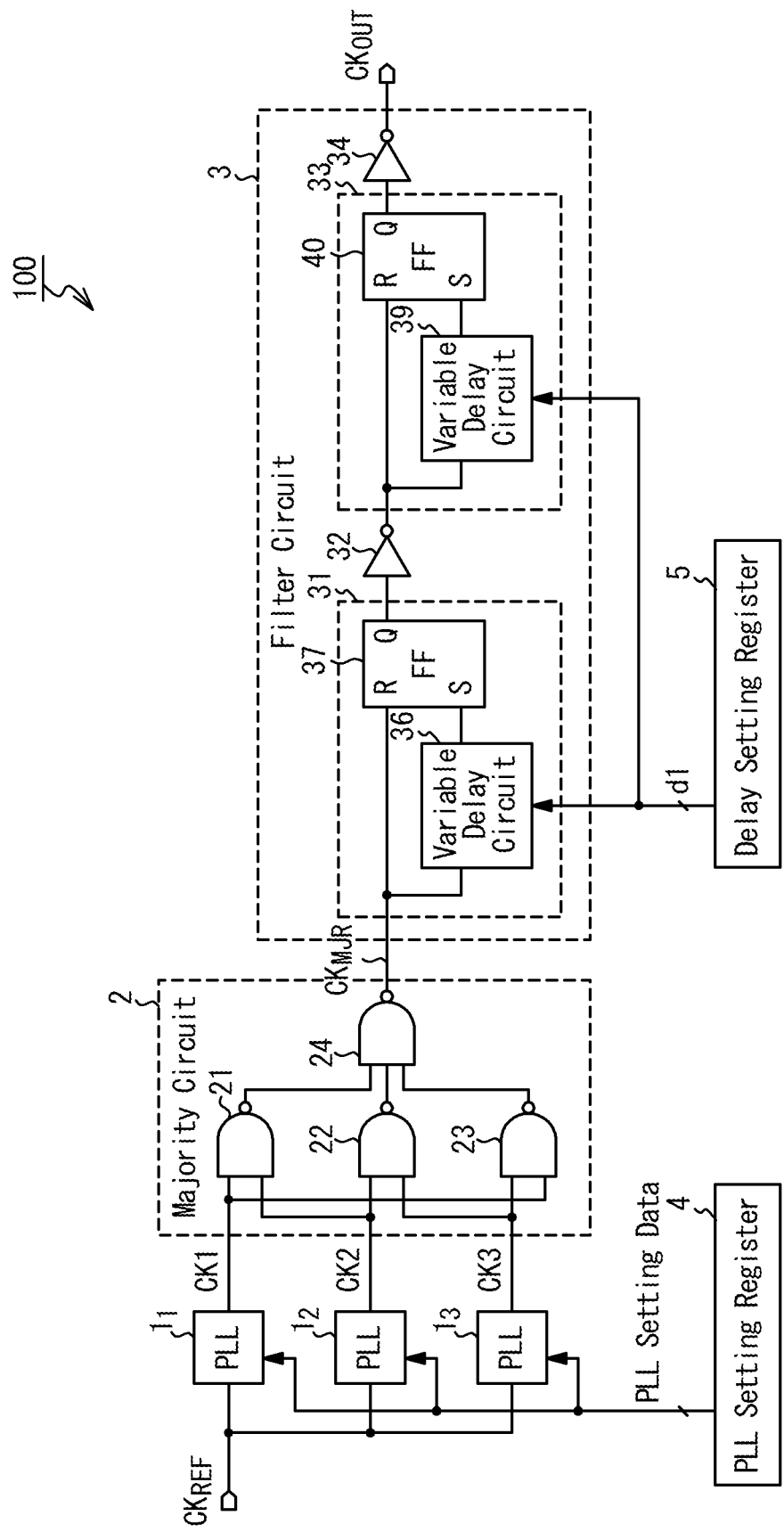
FIG. 6 is a block diagram illustrating the configuration of a semiconductor device, according to another embodiment.

FIG. 6 illustrates the filter circuit 3 from which the inverters 35 and 38 are omitted. In the configuration of FIG. 6, the majority clock signal $CK_{MJR}$ is provided to the reset terminal of the RS flipflop 37, and the output signal of the inverter 32 is provided to the reset terminal of the RS flipflop 40. It should be noted however that, since the configuration of FIG. 6 requires setting a longer delay time d1 to the variable delay circuits 36 and 39, it is preferable to dispose the inverters 35 and 38 as illustrated in FIG. 1.

The configuration of the filter circuit 3 may be modified in different ways. For example, a different filter that operates as a low-pass filter, such as an RC filter, may be used as the filter circuit 3.

Figure 7:
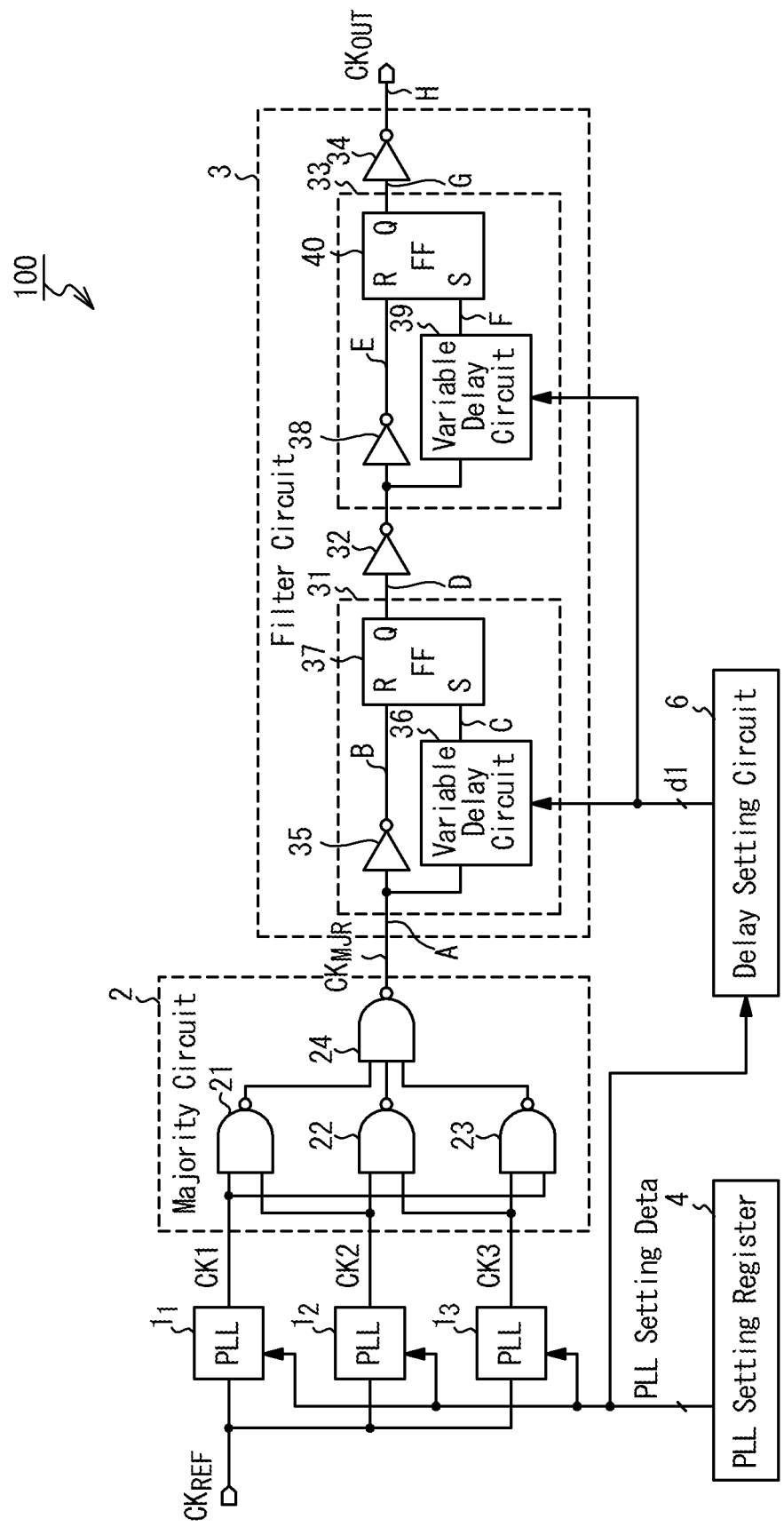
FIG. 7 is a block diagram illustrating the configuration of a semiconductor device, according to still another embodiment.

To facilitate setting the delay time d1 of the variable delay circuits 36 and 39 in accordance with the oscillation frequency of the PLL circuits $1_1$ to $1_3$, as illustrated in FIG. 7, a delay setting circuit 6 may be disposed which calculates the delay time d1 from the PLL setting data stored in the PLL setting register 4 and generates delay setting data that specifies the delay time d1. In this case, the variable delay circuits 36 and 39 are set to have the delay time d1 specified by the delay setting data generated by the delay setting circuit 6.

In this embodiment, in which the majority circuit 2 and the filter circuit 3 are not multiplexed, incoming of radiation to the circuit elements that constitute the majority circuit 2 and the filter circuit 3 may cause malfunction; however, the majority circuit 2 and the filter circuit 3 are hard to malfunction even in an environment with intense radiation, because the circuit sizes of the majority circuit 2 and the filter circuit 3 can be reduced. To improve operation reliability of the majority circuit 2 and the filter circuit 3, a plurality of MOS transistors having gates supplied with the same signal may be connected in series in a logic gate contained in the majority circuit 2 or the filter circuit 3.

Figure 8:
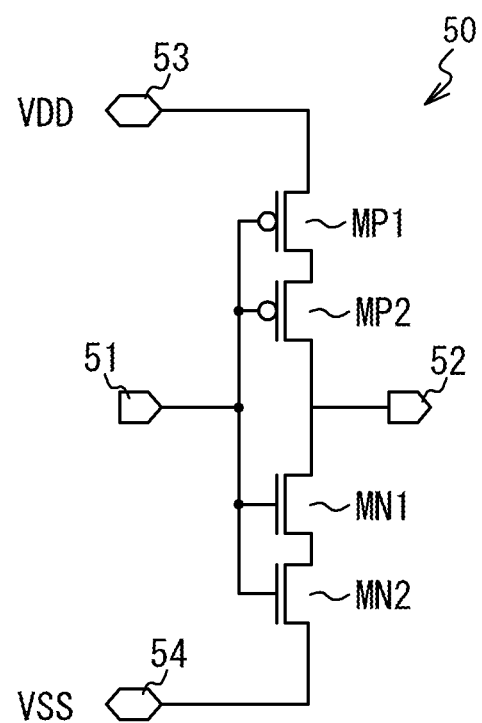
FIG. 8 is a circuit diagram illustrating one example of the configuration of an inverter in which a plurality of MOS transistors are serially connected, the plurality of MOS transistors having gates to which the same signal is supplied.

For example, as illustrated in FIG. 8, an inverter 50 may include PMOS transistors MP1, MP2 and NMOS transistors MN1 and MN2. The PMOS transistors MP1 and MP2 have gates commonly connected to an input terminal 51 and are connected in series between an output terminal 52 and a power line 53 on which a power source voltage VDD is generated. The NMOS transistors MN1 and MN2 have gates commonly connected to the input terminal 51 and are connected in series between the output terminal and a ground line 54 which has a ground level VSS.

While embodiments of the present invention have been specifically described, the present invention is not limited to the above-described embodiments. It would be appreciated by a person skilled in the art that the present invention may be implemented with various modifications.

The present application claims priority based on Japanese patent application No. 2018-114846, filed on Jun. 15, 2018, the disclosure of which is incorporated herein by reference in its entirety.

The invention claimed is:

1. A semiconductor device, comprising:
first to N-th PLL circuits configured to operate in synchronization with a common reference clock signal to output first to N-th clock signals, respectively, for N being an odd number of three or more;
a majority circuit that performs a majority operation on the first to N-th clock signals to generate a majority clock signal; and
a filter circuit to which the majority clock signal is provided, the filter circuit operating as a low-pass filter to output an output clock signal,
wherein the filter circuit comprises:
a first RS flipflop that has a reset terminal to which the majority clock signal or an inverted signal of the majority clock signal is provided; and
a first delay circuit that supplies a first delay signal to a set terminal of the first RS flipflop, the first delay signal being generated by delaying the majority clock signal,
wherein the output clock signal is generated in response to a signal output from a data output of the first RS flipflop.

2. The semiconductor device according to claim 1, wherein the filter circuit further comprises a first inverter to which the majority clock signal is provided, and
wherein an output signal of the first inverter is provided to the reset terminal of the first RS flipflop.

3. The semiconductor device according to claim 2, wherein the first delay circuit is configured to have a variable delay time.

4. The semiconductor device according to claim 3, further comprising a delay setting register storing delay setting data that specifies the delay time.

5. The semiconductor device according to claim 3, further comprising a delay setting circuit that sets the delay time of the first delay circuit based on PLL setting data that specifies an oscillation frequency of the first to N-th PLL circuits.

6. The semiconductor device according to claim 1, wherein the first delay circuit is configured to have a variable delay time.

7. The semiconductor device according to claim 6, further comprising a delay setting register storing delay setting data that specifies the delay time.

8. The semiconductor device according to claim 6, further comprising a delay setting circuit that sets the delay time of the first delay circuit based on PLL setting data that specifies an oscillation frequency of the first to N-th PLL circuits.

9. A semiconductor device, comprising:
first to N-th PLL circuits configured to operate in synchronization with a common reference clock signal to output first to N-th clock signals, respectively, for N being an odd number of three or more;
a majority circuit that performs a majority operation on the first to N-th clock signals to generate a majority clock signal; and
a filter circuit to which the majority clock signal is provided, the filter circuit operating as a low-pass filter to output an output clock signal,
wherein the filter circuit comprises:
a first filter to which the majority clock signal is provided;
a second inverter to which an output signal of the first filter is provided; and
a second filter to which an output signal of the second inverter is provided,
wherein the first filter is configured to output a clock signal with a duty ratio different from that of the majority clock signal, and
wherein the first filter and the second filter have the same configuration.

10. A semiconductor device, comprising:
first to N-th PLL circuits configured to operate in synchronization with a common reference clock signal to output first to N-th clock signals, respectively, for N being an odd number of three or more;
a majority circuit that performs a majority operation on the first to N-th clock signals to generate a majority clock signal; and
a filter circuit to which the majority clock signal is provided, the filter circuit operating as a low-pass filter to output an output clock signal,
wherein the filter circuit comprises:
a first filter to which the majority clock signal is provided;
a second inverter to which an output signal of the first filter is provided; and
a second filter to which an output signal of the second inverter is provided,
wherein the first filter comprises:
a third inverter to which the majority clock signal is provided;
a first RS flipflop; and
a first delay circuit that supplies a first delay signal to a set terminal of the first RS flipflop, the first delay signal being generated by delaying the majority clock signal;
wherein the second filter comprises:
a fourth inverter to which an output signal of the second inverter is provided;
a second RS flipflop; and
a second delay circuit that supplies a second delay signal to a set terminal of the second RS flipflop, the second delay signal being generated by delaying the output signal of the second inverter.

11. The semiconductor device according to claim 10, wherein the first delay circuit and the second delay circuit are configured to have the same delay time, the delay time being variable.

12. The semiconductor device according to claim 11, further comprising a delay setting circuit that sets the delay time of the first delay circuit and the second delay circuit based on PLL setting data that specifies an oscillation frequency of the first to N-th PLL circuits.

* * * * *